United States Patent
Havermans et al.

(10) Patent No.: US 12,132,191 B2
(45) Date of Patent: Oct. 29, 2024

(54) METHOD FOR APPLYING A FUNCTIONAL COMPOUND ON SULFUR PARTICLES

(71) Applicant: VITO NV, Mol (BE)

(72) Inventors: Danny Havermans, Mol (BE); Sébastien Sallard, Mol (BE); Ahmed Shafique, Mol (BE); Dirk Vangeneugden, Mol (BE); Annick Vanhulsel, Mol (BE); An Hardy, Hasselt (BE)

(73) Assignee: VITO NV, Mol (BE)

( * ) Notice: Subject to any disclaimer, the term of this patent is extended or adjusted under 35 U.S.C. 154(b) by 160 days.

(21) Appl. No.: 17/904,699

(22) PCT Filed: Feb. 18, 2021

(86) PCT No.: PCT/EP2021/054036
§ 371 (c)(1),
(2) Date: Aug. 19, 2022

(87) PCT Pub. No.: WO2021/165403
PCT Pub. Date: Aug. 26, 2021

(65) Prior Publication Data
US 2023/0088349 A1    Mar. 23, 2023

(30) Foreign Application Priority Data

Feb. 19, 2020    (EP) .................................... 20158323

(51) Int. Cl.
*H01M 4/04*    (2006.01)
*C01B 17/02*    (2006.01)
(Continued)

(52) U.S. Cl.
CPC ....... *H01M 4/0428* (2013.01); *C01B 17/0248* (2013.01); *C23C 16/26* (2013.01);
(Continued)

(58) Field of Classification Search
CPC ...................................................... H01M 4/04
See application file for complete search history.

(56) References Cited

U.S. PATENT DOCUMENTS

| 2015/0056507 A1 | 2/2015 | Dadheech et al. |
| 2015/0311508 A1 | 10/2015 | Cairns |
| 2017/0121807 A1* | 5/2017 | Deng .................. H01M 4/1391 |

FOREIGN PATENT DOCUMENTS

| CN | 102097622 A | 6/2011 |
| CN | 107910509 A | 4/2018 |

OTHER PUBLICATIONS

International Search Report and Written Opinion of the International Searching Authority from the European Patent Office, in PCT/EP2021/054036 dated Apr. 8, 2021, which is an international application corresponding to this U.S. application.

(Continued)

*Primary Examiner* — Austin Murata
(74) *Attorney, Agent, or Firm* — Kolitch Romano Dascenzo Gates LLC

(57) ABSTRACT

The present disclosure is related to a method for applying a functional compound on sulfur particles by means of an atmospheric pressure plasma discharge including a gas or an activated gas flow resulting from the atmospheric pressure plasma discharge. The coating composition includes an inorganic electrically conductive compound, an electrically conductive carbon compound, an organic precursor compound of a conjugated polymer, a precursor of a hybrid organic-inorganic compound, or a mixture, and the functional compound provides the sulfur particles with an electrically conductive surface.

20 Claims, 4 Drawing Sheets

(51) Int. Cl.
| | |
|---|---|
| *C23C 16/26* | (2006.01) |
| *C23C 16/30* | (2006.01) |
| *C23C 16/34* | (2006.01) |
| *C23C 16/40* | (2006.01) |
| *H01M 4/36* | (2006.01) |
| *H01M 4/62* | (2006.01) |
| H01M 4/02 | (2006.01) |
| H01M 10/052 | (2010.01) |

(52) U.S. Cl.
CPC ............ *C23C 16/305* (2013.01); *C23C 16/34* (2013.01); *C23C 16/40* (2013.01); *H01M 4/366* (2013.01); *H01M 4/624* (2013.01); *H01M 4/625* (2013.01); *C01P 2002/52* (2013.01); *C01P 2004/80* (2013.01); *C01P 2006/40* (2013.01); *H01M 2004/028* (2013.01); *H01M 10/052* (2013.01)

(56) References Cited

OTHER PUBLICATIONS

Li, Weiyang, et al; "Understanding the Role of Different Conductive Polymers in Improving the Nanostructured Sulfur Cathode Performance," American Chemical Society, 2013, Nano Lett. 13, 5534-5540.

Chen, Hongwei et. al; "Ultrafine Sulfur Nanoparticles in Conducting Polymer Shell as Cathode Materials for High Performance Lithium/Sulfur Batteries," Scientific Reports, vol. 3, Article No. 1910 (2013).

\* cited by examiner

METHOD FOR APPLYING A FUNCTIONAL COMPOUND ON SULFUR PARTICLES

TECHNICAL FIELD

The present disclosure is related to a method for applying a functional compound, for example a coating, on sulfur particles by means of an atmospheric pressure plasma discharge, wherein the functional compound provides the sulfur particles with an electrically conductive surface. The disclosure is further related to treated sulfur particles, a cathode comprising the treated sulfur particles and a lithium-sulfur battery cell comprising the cathode.

INTRODUCTION

Lithium (Li)-based battery cells and batteries are nowadays widely used because lithium has the lowest reduction potential of any element, allowing lithium-based batteries to have a very high cell potential. Lithium is the third lightest element and has one of the smallest ionic radii of any single charged ion. These factors allow lithium-based batteries to have high gravimetric and volumetric capacity and power density.

One particular example is the lithium-ion battery, which, contrary to batteries used before, allows to be recharged, even when the battery is not fully discharged. Since the '90, Li-ion batteries have become the standard. However, although multivalent cations in Li-ion batteries allow for a high charge capacity per ion, the additional charge reduces the ion mobility, which reduces the ionic diffusion in the solid electrodes. This effect is a rate-limiting factor for the battery power performance.

Further, one of the concerns with regards to the future is that a shortage of some of the transition metals currently used in Li-ion batteries is very probable, which will increase the price of the batteries. Some of the metals used currently in the batteries, such as Co, Mn and Ni, are already expensive, increasing the price of Li-ion batteries.

Lithium-sulfur (Li—S) batteries, with a sulfur based cathode and a metal lithium anode, are considered as one of the promising next-generation energy storage systems, targeting applications such as electrical and portable devices, and electric vehicles. Li—S batteries have, in theory, an extremely high (specific) capacity (around 1675 mAh/g) and energy density (around 2600 Wh/kg) compared to other solutions known in the field, assuming complete conversion of sulfur to $Li_2S$. Sulfur is less expensive and less rare than the materials used in Li-ion batteries. Hence, Li—S batteries may provide an excellent battery power performance, an economical benefit and a more environmentally friendly solution.

US2015/0311508 discloses nanoparticles for use as a cathode material in a Li—S cell. The nanoparticles are produced from sulfur particles dissolved in an organic solvent and have a $Li_2S$ core with a shell or coating that conducts electrons and lithium ions. The shell may be a carbon shell or a transition metal sulfide shell deposited by means of a chemical vapor deposition (CVD) process. The cathode is then produced by combining the coated $Li_2S$ nanoparticles with an organic solvent and a polymeric binder.

CN102097622 discloses a Li—S secondary battery with a sulfur-containing composite cathode material comprising particles having a conductive nano-carbon black-sulfur core, and an organic polymer coating comprising a plasticizer, adhered to an aluminum current collector.

CN107910509 discloses a sulfur comprising cathode material for a Li—S battery cell. The cathode consists of elemental sulfur distributed uniformly into an electrically conductive graphene network. The production process is a wet chemical process using amongst others expanded graphite, potassium permanganate, hydrogen peroxide ($H_2O_2$) and concentrated (e.g. 98%) sulfuric acid ($H_2SO_4$).

US2015/0372291 discloses a cathode for a Li—S battery comprising sulfur-comprising particles inserted in a porous carbon structure coated with a 1 µm to 30 µm thick nanogranular conductive coating comprising nanoparticles with a size between 20 nm and 100 nm. The sulfur-source may be elemental sulfur and is preferably inserted by means of slurry impregnation.

'Ultrafine sulfur nanoparticles in conducting polymer shell as cathode materials for high performance lithium/sulfur batteries', Hongwei Chen, Weiling Dong et. al., Scientific Reports, Volume 3, Article number 1910 (2013), discloses the use of sulfur nanoparticles (10 nm-20 nm) that are coated with a conductive poly(3,4-ethylenedioxythiophene) coating (PEDOT coating) via a wet chemical process using a dispersion in water and requiring the addition of $FeCl_3$ for the use of the $Fe^{3+}$ ions as oxidant to polymerize the coating precursor. The S/PEDOT nanoparticles are used as cathode material in a Li—S coin cell.

Despite the available prior art, the state of the art Li—S batteries show several critical shortcomings and problems, limiting their commercialization and breakthrough. Further, the prior art processes for producing the battery materials have significant drawbacks, such as without being limited thereto, the use of harsh, non-environmentally friendly chemicals and solvents, the use of wet chemical processes producing considerable waste streams, and processes performed at elevated temperatures.

A first problem is that both sulfur and lithium sulfides are intrinsically insulators, which limits the transportation of electrons and ions.

A second problem is the fast decrease of the energy storage capacity due to the dissolution in the organic electrolyte of intermediate discharge products, in particular long-chain lithium polysulfide ($Li_2S_n$, wherein n is between 4 and 8 formed during the discharge process), the diffusion hereof to the anode and the reaction with the lithium anode. This process is known as sulfur shuttling, causing irreversible active material losses, inducing rapid capacity fading and low Coulombic efficiency which greatly impede the practical application of lithium-sulfur batteries. Transition between long-chain and short-chain lithium polysulfides consumes electrical energy, thereby restricting the electrical efficiency.

A third problem is the diffusion of dissolved lithium polysulfides through the electrolyte towards the anode, which form a membrane on the anode surface, which in turn leads to the crazing of the solid electrolyte interface film (SEI). An unstable film is generated and the instability of solid electrolyte interface film has a negative effect on the cycling stability of Li—S batteries.

A further problem is that repeated battery charging/discharging causes a high volume change (shrinking and expansion) of the sulfur in the cathode material of up to 80%, because the mass density of sulfur is about 20% larger than that of $Li_2S$. Such extremely high volume changes lead to high mechanical stress and damage of the electrode structure, and result in a poor lifespan of the Li—S battery.

Yet another problem is the deposition of lithium sulfides, the ultimate discharge products, on the conductive framework of the battery cell because of their low solubility in the electrolyte. This is the so-called growth of lithium dendrites in the electrolyte, which causes a reduction in capacity and lifespan of the battery.

SUMMARY

There is a need in the art to overcome at least part of the above drawbacks in state-of-the-art Li—S batteries. There is a need to provide improved sulfur based cathodes. Additionally, there is a need to provide improved materials for manufacturing such cathodes.

The present disclosure aims to provide improved methods for manufacturing such improved materials for sulfur-based cathodes.

According to the present disclosure, there is therefore provided a method for applying a functional compound on sulfur particles, particularly on the surface of sulfur particles. Methods according to the disclosure comprise the steps of: (i) supplying (a) a feed comprising sulfur particles and/or (b) a coating composition to: (c) an atmospheric pressure plasma discharge comprising a gas and/or (d) an activated or reactive gas flow resulting from the atmospheric pressure plasma discharge; and (ii) contacting the sulfur particles and the coating composition. The coating composition is converted into the functional compound and is applied to the sulfur particles in step (i) and/or in step (ii). The coating composition advantageously comprises at least one inorganic electrically conductive compound. Alternatively, or in addition, the coating composition can comprise at least one electrically conductive carbon compound. Alternatively, or in addition, the coating composition can comprise at least one organic precursor compound of a conjugated polymer. Alternatively, or in addition, the coating composition can comprise at least one (precursor of a) hybrid organic-inorganic compound. The functional compound provides the sulfur particles with an electrically conductive surface. Such a conductive surface can be obtained by functionalization of the surface of the sulfur particles with the functional compound, or by (completely) coating the surface of the sulfur particles with the functional compound.

According to the present disclosure, a coating composition is applied on sulfur particles assisted by atmospheric pressure plasma, which allows to improve the physical and/or chemical properties of the coating that is applied on the surface of the sulfur particles, advantageously resulting in improved mechanical and chemical stability for example a reduced solubility of the coating and/or the functional compounds that are applied. Furthermore, in case of organic and hybrid organic-inorganic coating compositions, the atmospheric pressure plasma-assisted coating deposition advantageously results in a better cross-linking of the coating compounds on the surface of the sulfur particles compared to other deposition techniques.

The sulfur particles and/or the coating composition can be exposed to the atmospheric pressure plasma discharge and/or the activated or reactive gas flow resulting therefrom (i.e., step (i)) prior to contacting the sulfur particles and the coating composition (i.e., step (ii)). Alternatively, step (i) and step (ii) are carried out simultaneously.

The method may comprise repeating steps (i) and (ii) multiple times, preferably 2 to 50 times.

The method may further comprise one or more of the following steps:

Drying the sulfur particles prior to contacting them with the coating composition, preferably at a temperature between 50° C. and 200° C.;

Curing the sulfur particles after step (ii), preferably by subjecting the sulfur particles comprising the functional compound to irradiation, preferably UV irradiation or electron beam irradiation, in which case the coating composition advantageously comprises a curable precursor compound; and Doping the feed of sulfur particles and/or the coating composition with an electrically conductive material, selected from the group of $I_2$, $NOBF_4$, $O_2$, $O_3$, ITO, or a mixture of two or more hereof.

The coating composition can comprise one or more of:

at least one organic precursor compound of the conjugated polymer selected from the group consisting of a vinyl compound, an allyl compound, an alkyne compound, an acrylate, optionally fluorinated, a methacrylate, optionally fluorinated, and a mixture of two or more thereof;

at least one inorganic electrically conductive compound, in particular selected from colloidal silica, amorphous silica, a surface-treated silica, colloidal alumina, amorphous alumina, conductive carbon, tin oxide, titanium oxide, vanadium oxide, titanium sulfide ($TiS_2$), zirconium oxide ($ZrO_2$), TiN, Ru, AlN, TaN, iron oxide, iron sulfide (FeS), iron titanate ($FeTiO_3$), barium titanate ($BaTiO_3$), stannic oxide ($SnO_2$), and mixtures of two or more thereof;

at least one electrically conductive carbon compound selected from graphene, conductive carbon fibers, carbon nanotubes, or a mixture of two or more thereof; and a hybrid organic-inorganic compound, for example an organically functionalized inorganic compound.

The coating composition can be supplied to the atmospheric pressure plasma discharge and/or to the activated gas flow resulting from the atmospheric pressure plasma discharge in the form of a liquid, an aerosol, a dispersion, an emulsion, a liquid solution, or a combination of two or more thereof.

The method of the present disclosure can further comprise a deposition step of a first coating on the sulfur particles prior to step (i) and/or (ii). The first coating can comprise silica, a surface-treated silica, alumina, conductive carbon, a tin oxide, a titanium oxide, a vanadium oxide, titanium sulfide, zirconium oxide, titanium nitride, ruthenium, aluminum nitride, tantalum nitride, iron oxide, iron sulfide, iron titanate, barium titanate, stannic oxide, or a mixture of two or more thereof. Preferably, the first coating comprises $TiO_2$, $ZrO_2$, $SiO_2$, $Al_2O_3$, TiN, Ru, AlN, vanadium oxide, or a mixture of two or more thereof.

The method of the present disclosure may further comprise a deposition step of a second coating on the sulfur particles following step (ii). Preferably, the second coating is a conductive coating. Preferably, the second coating comprises graphene, conductive carbon fibers, or a combination thereof.

The present disclosure further provides treated sulfur particles comprising a functional compound, i.e., functionalized sulfur particles. The sulfur particles are preferably treated/functionalized by methods as described herein to apply the functional compound on a surface of the particles. The treated sulfur particles comprise a sulfur core and a functional compound arranged in a layer around the sulfur core. The layer can form a shell or coating of the treated sulfur particles. The functional compound provides the sulfur particles with an electrically conductive (surface) layer. The functional compound is obtainable by methods as described herein. The functional compound can comprise a conjugated polymer of at least one organic precursor, at least one inorganic electrically conductive compound, at least one electrically conductive carbon compound, at least one precursor of a hybrid organic-inorganic compound, or a mixture of two or more thereof.

The present disclosure further provides a cathode comprising the treated/functionalized sulfur particles as described herein. The cathode may comprise a cathode coating, preferably conductive to $Li^+$ ions and insulating to electrons.

The present disclosure further provides a lithium-sulfur battery cell comprising a cathode as described herein.

In the light of the present disclosure, a conjugated polymer refers to a polymer wherein the polymer backbone is a backbone of connected p orbitals with delocalized electrons. In particular the polymer backbone consists of alternating saturated and unsaturated bonds, in particular alternating single and multiple bonds, for example single and double carbon-carbon bonds, e.g. in a linear structure, non-branched or branched, or a ring-structure. The strong chemical bonds between the carbon atoms are the so-called localized a bonds, whereas the double bonds provide weaker and less strongly localized π bonds.

Whenever in the present disclosure the wording 'battery' and 'battery cell' are used, they refer to both a battery and a battery cell.

Methods of the present disclosure allow to produce sulfur particles having an electrically conductive surface. Thereby, the sulfur particles may either be individual particles or agglomerates of several individual sulfur particles. The sulfur particles coated according to the method of this disclosure when used in the cathode of Li—S battery cells, provide Li—S battery cells having one or more of the following features, without being limited thereto:
- a real energy density closer to the theoretical energy density compared to solutions disclosed in the prior art,
- a reduced charging time which is attributed to the increased conductivity of the sulfur particles
- an extended lifetime.

It is assumed that the extended lifetime can be obtained by a combination of a better control of the volume change of the sulfur upon charging and discharging because of a certain degree of elasticity provided by the functional compound, a reduction of $Li_2S$ precipitation and of the lithium dendrite growth, and a reduction of irreversible loss of sulfur and shuttling of sulfur due to the solubility of polysulfides.

The method of the present disclosure presents further the advantage that the functional compound is applied to the individual sulfur particles. As a result, the risk to sulfur polymerization may be counteracted on particle level, which cannot be achieved with prior art methods which aim at coating the sulfur cathode as a whole.

Atmospheric pressure plasma discharge technology is a dry, clean and environmentally friendly technology that permits excluding the use of water and/or solvents. The advantage of the dry processing provided by atmospheric pressure plasma discharge technology is that the structure and composition of the functional compound that is deposited to the particles can be better controlled on individual particle level, whereas the treatment of sulfur particles in a solvent may lead to unwanted agglomeration, sintering, particle size reduction upon solvent removal, which may reach levels up to 80% volume reduction. Agglomeration, in particular to a particle size having a D50 value higher than 50 μm (meaning that 50% of the particles have an average size equal to or lower than the 50 μm), is unwanted because too large particles are known to be less suitable for use in battery materials because they lead to less uniformity for the electrode and a less efficient adhesion between the electrode and the battery separator—if one is used—leading to an increased interfacial resistance and a reduction of the battery performance (see for example 'Lithium-sulfur secondary batteries—a review', by Xiaohui Zhao, Gouri Cheruvally, et al, Journal of Electrochemical Science and Technology 2016;7(2):97-114).

Atmospheric pressure plasma methods and processes can be carried out at a temperature of the sulfur particles below 200° C., and preferably below the melting temperature of the particles. Working at such temperatures reduces the risk of unwanted agglomeration of particles.

Atmospheric pressure plasma methods and processes can be performed at an industrial scale, and allow to apply a functional compound, such as a coating, to all sides of the particle.

BRIEF DESCRIPTION OF THE DRAWINGS

Aspects of the present disclosure will now be described in an illustrative manner with reference to the appended drawings, wherein same reference numerals illustrate same features.

DETAILED DESCRIPTION

Figure 1:
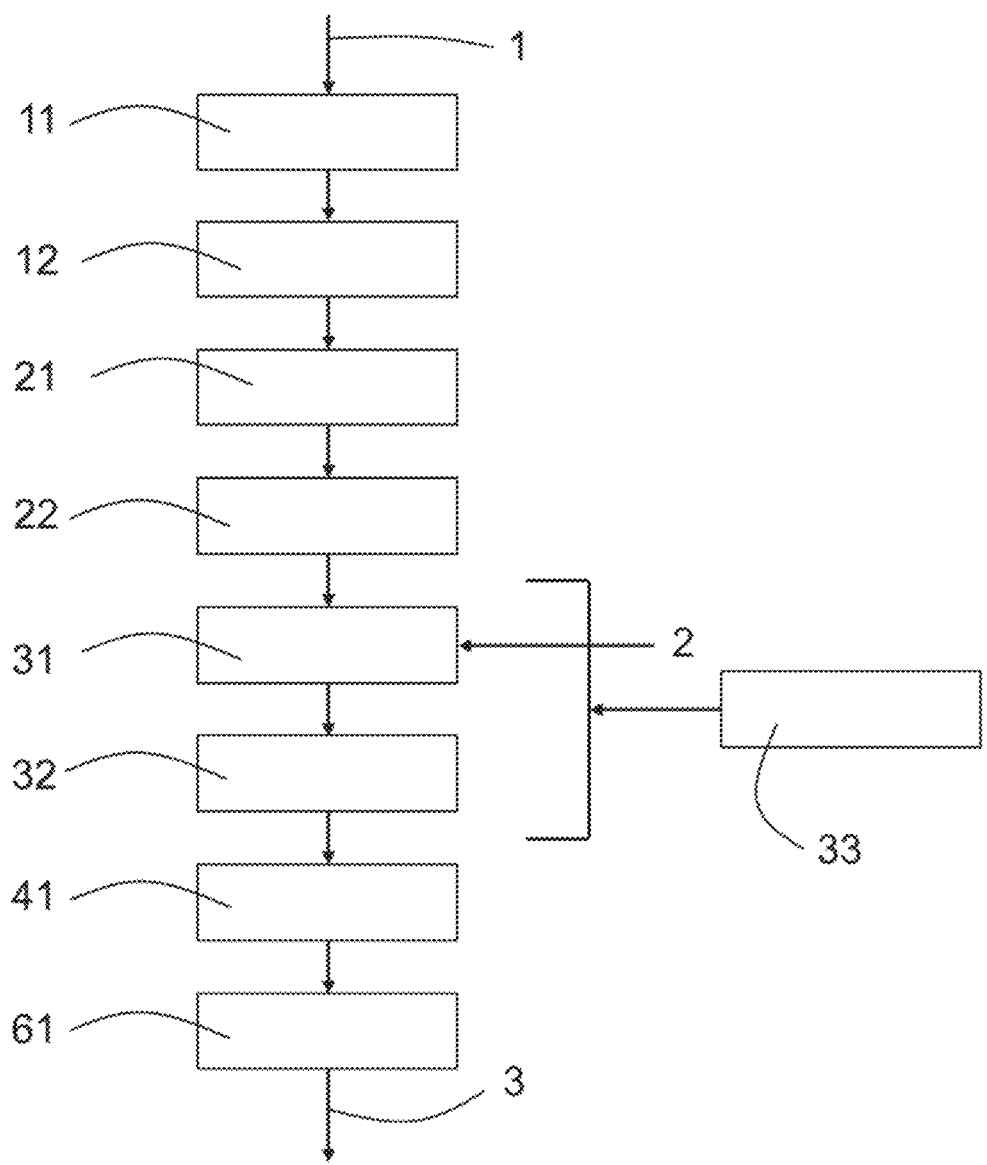
FIG. 1 represents a schematic representation of the process steps of methods according to the present disclosure.
Figure 2:
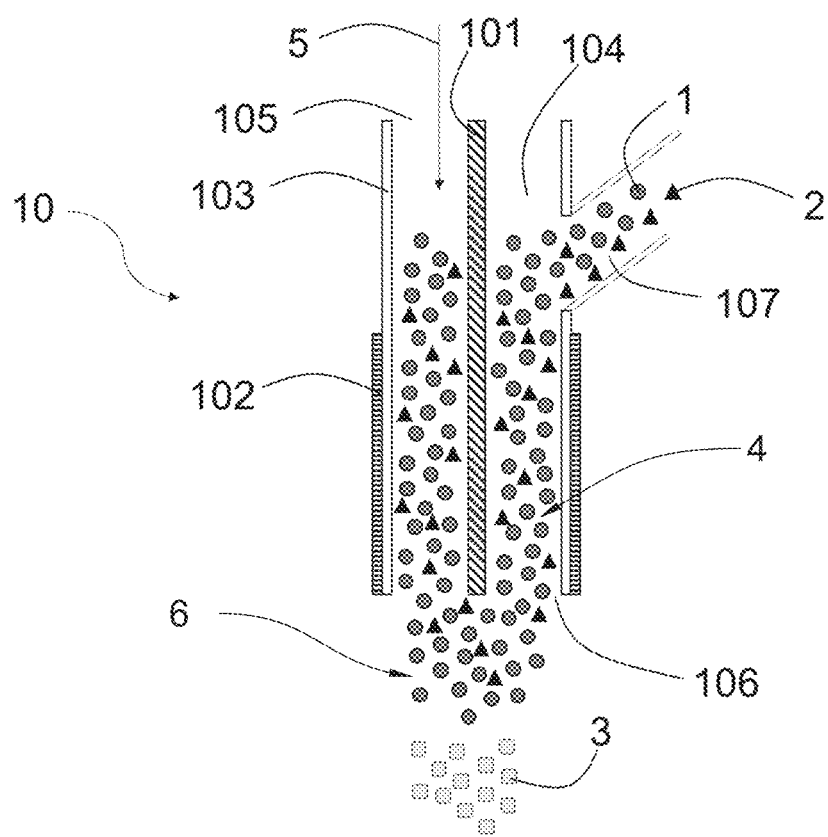
FIG. 2 represents a schematic representation of the cross-section of an apparatus and set-up used in the present disclosure.

The present disclosure describes a method for applying a functional compound on sulfur particles. Referring to FIG. 1, the method comprises the steps of supplying 31 one or more of a feed of sulfur particles 1 and a coating composition 2; and the step of contacting 32 the sulfur particles 1 and the coating composition 2. Referring to FIG. 2, the one or more of a feed of sulfur particles 1 and a coating composition 2 are supplied to an atmospheric pressure plasma discharge 4 comprising a gas 5 or an activated gas flow resulting from the atmospheric pressure plasma discharge 6, or both. The coating composition comprises at least one inorganic electrically conductive compound, at least one electrically conductive carbon compound, at least one organic precursor compound of a conjugated polymer, at least one precursor of a hybrid organic-inorganic compound, or a mixture of two or more thereof. During the contacting step 32, the functional compound is applied to the sulfur particles 1. The functional compound provides the sulfur particles with an electrically conductive surface.

The sulfur particles will usually comprise at least 95% elemental sulfur, based on the dry weight of the particles, and preferably at least 96%, 97%, 98%, 99%, 99.5%, 99.9%, or 99.99% of elemental sulfur.

The sulfur particles advantageously have a D50 value, based on the diameter or equivalent diameter of a spherical particle having the same volume, between 10 nm and 600 µm, for example between 100 nm and 500 µm, between 500 nm and 250 µm, between 750 nm and 100 µm, for example between 1 µm and 50 µm, e.g. between 1 µm and 20 µm. The D50 value for the particle diameter is the diameter for which 50% of the particles have a diameter equal to or lower than the D50 value. Preferably, the sulfur particles have a D50 value equal to or lower than 10 µm.

The D50 value is obtained from the particle size distribution, together with other D-values, such as the D10 value (the diameter for which 10% of the particles have a diameter equal to or lower than the D10 value), and the D90 value (the diameter for which 90% of the particles have a diameter equal to or lower than the D90 value). The particle size distribution can be measured by means of laser diffraction on pre-dried sulfur particles, or by means of sieve analysis on pre-dried sulfur particles. An example of equipment for performing a laser diffraction measurement is the Microtrac S3500 SDC.

The sulfur particles are advantageously solid particles which advantageously are not hollow.

Exposure of the sulfur particles and/or the coating composition to the atmospheric pressure plasma discharge comprising a gas is a so-called direct exposure of the sulfur particles and/or the coating composition to the atmospheric pressure plasma discharge. The gas is activated to ignite the plasma discharge, i.e. create a plasma, wherein the plasma comprises the active gas.

Alternatively, or in addition, the sulfur particles and/or the coating composition may be exposed to the activated gas flow resulting from the atmospheric pressure plasma discharge comprising the gas. This is a so-called indirect or remote exposure of the sulfur particles and/or the coating composition to the atmospheric pressure plasma discharge. Indirect exposure may be used when a more gentle plasma process is required, because the energy of the activated gas flow which has left the plasma discharge is lower than the energy of an activated gas flow in the atmospheric pressure plasma discharge.

The gas may be an inert gas, for example nitrogen ($N_2$), helium (He), argon (Ar) or carbon dioxide ($CO_2$). Alternatively, the gas may be a reactive gas, such as hydrogen ($H_2$), oxygen ($O_2$), air, or ozone ($O_3$). The gas may comprise a mixture of one or more inert gases and/or one or more reactive gases. Preferably, the gas comprises an oxidizing gas as reactive gas, such as $O_2$, air or $O_3$, or a mixture of an inert gas and an oxidizing gas.

Preferably, the feed of sulfur particles comprises the sulfur particles in a gas stream, i.e. a feed gas or a carrier gas. The feed gas may be an inert gas, such as helium (He), argon (Ar) or nitrogen ($N_2$). Alternatively, the carrier gas may be a reactive gas, such as oxygen ($O_2$), hydrogen ($H_2$), air, ozone ($O_3$). Further, the carrier gas may be a combination of two or more gasses, inert and/or reactive, for example oxygen and argon, or hydrogen and nitrogen. Other suitable feed gases include, without being limited thereto, $CO_2$, CO, $SF_6$, NO, $NO_2$, $N_2O$, $H_2$, methane, ethane, propane, butane, ethylene, propylene, ethylene oxide, propylene oxide, acetylene, $CF_4$, $C_2F_6$, $C_2F_4$, $H_2O$ and/or a mixture of two or more thereof.

According to a first embodiment of the method of the disclosure, the sulfur particles are exposed to either one or both of the atmospheric pressure plasma discharge and the activated gas flow resulting therefrom, prior to contacting the sulfur particles with the coating composition. This may result in a first treatment, i.e. pre-treatment, of the sulfur particles by the activated gas flow. When the sulfur particles are immediately exposed to the atmospheric pressure plasma discharge, they may optionally be pre-treated by the feed gas as well.

The pre-treatment of the sulfur particles may involve a cleaning step and/or activation step of the sulfur particles. This allows for example the removal of organic contamination from the surface of the sulfur particles. Alternatively, or in addition, the pre-treatment advantageously provides an activation of the surface of the sulfur particles, which may enhance the subsequent adhesion of the functional compound.

According to a second embodiment of the method of the disclosure, the coating composition is exposed to either one or both of the atmospheric pressure plasma discharge and the activated gas flow resulting therefrom, prior to contacting the coating composition with the sulfur particles. This may result in an excitation of the coating composition by the activated gas flow, prior to the application of the functional compound on the sulfur particles by means of the excited coating composition.

According to a third embodiment, the first embodiment and the second embodiment are combined. The feed of sulfur particles may be supplied to and exposed to either one or both of the atmospheric pressure plasma discharge and the activated gas flow resulting therefrom, prior to supplying and exposing the coating composition to one or both of the atmospheric pressure plasma discharge and the activated gas flow resulting therefrom. Alternatively, the coating composition may be supplied to and exposed to either one or both of the atmospheric pressure plasma discharge and the activated gas flow resulting therefrom, prior to supplying and exposing the feed of sulfur particles to the same. Alternatively, the feed of sulfur particles and the coating composition may be simultaneously supplied to and exposed to either one or both of the atmospheric pressure plasma discharge and the activated gas flow resulting therefrom.

According to the methods of the present disclosure, the step of supplying one or more of a feed of sulfur particles and a coating composition to either one or both of the atmospheric pressure plasma discharge comprising a gas and the activated gas flow resulting therefrom, is followed by the step of contacting the sulfur particles and the coating composition to apply the functional compound to the sulfur particles.

According to a first embodiment of the contacting step, the coating composition may react directly upon contacting with the sulfur particles, wherein the functional compound is obtained or applied during the direct reaction, for example by means of polymerization. Preferably, the coating composition has been excited as described above prior to contacting with the sulfur particles. The excitation of the coating composition may be performed by means of the gas present in the atmospheric pressure plasma discharge or the activated gas resulting therefrom.

According to a second embodiment of the contacting step, the coating composition may react indirectly upon contacting with the sulfur particles, wherein the coating composition is applied to the sulfur particles upon contacting and wherein the functional compound is obtained or applied afterwards, for example by means of polymerization. The coating composition may have been excited prior to contacting with the sulfur particles. Alternatively and preferably, the coating composition has not been excited prior to contacting with the sulfur particles, wherein the coating composition is excited after contacting with the sulfur particles for conversion into the functional compound, i.e. delayed excitation. Delayed excitation of the coating composition may be performed by means of the gas present in the atmospheric pressure plasma discharge or the activated gas resulting therefrom. Alternatively, delayed excitation of the coating composition may be performed on the sulfur particles after exiting the atmospheric pressure plasma discharge or the activated gas resulting therefrom, for example by curing. After having been applied to the sulfur particles, the coating composition may require curing. Curing may be a curing by irradiation, such as UV irradiation, IR irradiation or electron beam irradiation, or by thermal curing. This will usually be carried out as a separate step, remote from the atmospheric pressure plasma discharge or the activated gas resulting therefrom.

According to a third embodiment of the contacting step, the first embodiment of the contacting step and the second embodiment of the contacting step are combined.

The method of the present disclosure may comprise repeating the steps of supplying and contacting multiple times, for example 1 to 200 times, such as 2 to 100 times, 2 to 50 times, 3 to 40 times, 4 to 30 times, or 5 to 25 times, such as more than 1 time and less than 200 times. Whether the steps of supplying and coating are repeated or not, and if they are repeated, the number of repetitions, depends, without being limited thereto, on the targeted electrical conductivity of the treated sulfur particles and the electrical conductivity of the sulfur particles to which the functional compound is applied in a single repetition.

According to a first embodiment of the repeated steps, the coating composition used in subsequent repetitions may be the same or may be a different composition. By varying the coating composition in consecutive steps, a coating comprising several layers having additional properties may be included in the functional compound, such as barrier properties.

According to a second embodiment of the repeated steps, in consecutive steps the process parameters of the step of supplying and/or contacting may be the same or may be different. For example, the voltage applied to generate the atmospheric pressure plasma discharge may be reduced or increased. Depending on the coating composition, an increased voltage may induce a higher degree of cross-linking of the functional compound, which may result in different properties, for example an enhanced barrier effect or an increase in electrical conductivity, or any other properties.

Another parameter that can be varied when the method comprises repeating the steps of supplying and contacting multiple times, is the nature of the gas used in the atmospheric pressure plasma discharge. In an example, a step wherein an inert gas is used, may be followed by a consecutive gas which makes use of a reactive gas in the atmospheric pressure plasma discharge, for example an oxidative gas that may enhance doping of the functional compound to increase the electrical conductivity, as explained hereafter. A reactive gas may also enhance the degree of cross-linking of the functional compound Other parameters that can be varied for the same reasons are for example, without being limited thereto, the flow rate of the atmospheric pressure plasma discharge gas, the flow rate of the coating composition, the flow rate of the feed of sulfur particles, and the size of the droplets of the coating composition, in particular when applied by means of an atomizer.

Varying the process parameters in consecutive steps when using the same coating composition may thus lead to the application of consecutive functional compounds with a different chemical composition and/or structure, such as different functional groups, a different degree of cross-linking or a different degree of fragmentation. Varying the process parameters in consecutive steps when using the same coating composition may thus lead to the application of consecutive layers of functional compounds with a different chemical composition and/or structure, such as different functional groups, a different degree of cross-linking or a different degree of fragmentation.

According to a third embodiment of the repeated steps, the first embodiment of the repeated steps and the second embodiment of the repeated steps are combined.

Referring to FIG. 1, the method of the present disclosure may comprise a drying step 11 of the sulfur particles 1 prior to contacting 32 the sulfur particles 1 and the coating composition 2. The drying may be performed at a temperature equal to or lower than 200° C., for example at a temperature between 30° C. and 200° C., between 40° C. and 200° C., between 50° C. and 200° C., such as between 75° C. and 175° C., or between 100° C. and 150° C.

The drying may be performed under ambient conditions or alternatively under an inert atmosphere. The drying step may be performed until the sulfur particles comprise a moisture degree of 10% or lower, such as 9%, 8%, 7%, 6%, 5% or lower, the percentage being the weight ratio of the moisture to the total weight of the sulfur particle (w/w). Alternatively, the drying step may be performed until the atmosphere wherein the sulfur particles are dried has a residual relative humidity equal to or lower than 20 RH %, such as 17 RH %, 15 RH %, 12 RH %, 10 RH %, 9 RH %, 8 RH %, 7 RH %, 6 RH %, 5 RH % or lower.

Many techniques known to the skilled person may be used to effectuate the drying step, for example freeze drying, exposing of the sulfur particles to dry air, vacuum drying, passing the sulfur particles several times through the plasma discharge in the absence of the precursor compound, or a combination of two or more of these techniques.

Advantageously, the particles are cooled 12 after the drying step 11, preferably to a temperature of 40° C. or less, for example to room temperature, or to 35° C., 30° C., 25° C., 20° C., 15° C., and/or preferably to a temperature of at least 0° C., such as at least 5° C. or 10° C.

After cooling—if performed—or drying, the sulfur particles may directly be supplied to the atmospheric pressure plasma discharge comprising a gas or to the activated gas flow resulting from the atmospheric pressure plasma discharge. Alternatively, after cooling—if performed—or drying, the sulfur particles may be stored prior to supplying them to the atmospheric pressure plasma discharge comprising a gas or to the activated gas flow resulting from the atmospheric pressure plasma discharge.

The coating composition in the present disclosure comprises at least one inorganic electrically conductive compound, at least one electrically conductive carbon compound, at least one organic precursor compound of a conjugated polymer, at least one precursor of a hybrid organic-inorganic compound, or a mixture of two or more thereof. The functional compound provides the sulfur particles with an electrically conductive surface or layer. The electrically conductive surface can be due to the functional compound being a coating, which is thus applied to the surface of the sulfur particles by the coating composition, or can be due to the functional compound being a functionalization of the surface of the sulfur particles. A surface functionalization of the sulfur particles comprises the application of the functional compound, wherein the thickness of the functional compound is e.g. lower than 1 nm. Preferably, a coating applied to the surface of the sulfur particles has a thickness that is measurable, i.e. equal to or higher than 1 nm, for example by means of cross-section TEM.

When the coating composition comprises two or more of the above compounds, the electrical conductivity is obtained from each compound of the coating composition individually, or from the interaction between the compounds of the coating composition. A mixture of different free-radical polymerizable compounds may be used, for example to tailor the physical properties of the substrate coating for a specified need.

Preferably, the coating composition comprises or consists substantially of an organic precursor compound of a conjugated polymer. The organic precursor compound may be a hydrocarbon consisting exclusively of carbon and hydrogen atoms, or it may be a compound comprising hetero atoms, for example N, S, O, and any other suitable hetero atoms. The organic precursor compound of the conjugated polymer is preferably selected from the group consisting of: a vinyl compound, an allyl compound, an alkyne compound, an acrylate, optionally fluorinated, a methacrylate, optionally fluorinated, a carboxylate, and a mixture of two or more thereof. The organic precursor compound of a conjugated polymer may be a mixture of different free-radical polymerizable organic precursor compounds of the conjugated polymer, for example to tailor the physical properties of the resulting functional compound for a specified need.

Examples of suitable (meth)acrylates and vinyl compounds are styrene, α-methylstyrene, methacrylonitriles, vinyl acetate, methyl (meth)acrylate, ethyl (meth)acrylate, propyl (meth)acrylate, butyl (meth)acrylate, and/or other alkyl (meth)acrylates, including organofunctional (meth) acrylates, such as glycidyl (meth)acrylate, trimethoxysilyl propyl (meth)acrylate, allyl (meth)acrylate, hydroxyethyl (meth)acrylate, hydroxypropyl (meth)acrylate, dialkylaminoalkyl (meth)acrylates, and fluoroalkyl (meth)acrylates, α-methylstyrene, and (meth)acrylic acid. Further examples of vinyl compounds are vinyl halides, such as vinyl chlorides and vinyl fluorides, (meth)acrylonitrile, (meth)acrylamide, such as N-isopropylacrylamide.

Examples of allyl compounds are allyl amine, allyl alcohol, alkenes and dienes, halogenated alkenes and fluorinated alkenes, for example perfluoroalkenes, such as fluorinated ethylene, propylene, vinylidene halides, butadienes.

Other examples of organic precursor compounds suitable for use in the present disclosure include fumaric acid and esters, itaconic acid and esters, maleic anhydride, halogenated alkenes, for example, vinyl halides, such as vinyl chlorides and vinyl fluorides, and fluorinated alkenes, for example perfluoroalkenes, acrylonitrile, methacrylonitrile, ethylene, propylene, allyl amine, vinylidene halides, butadienes, acrylamide, such as N-isopropylacrylamide, methacrylamide, epoxy compounds, for example glycidoxypropyltrimethoxysilane, glycidol, styrene oxide, butadiene monoxide, ethyleneglycol diglycidylether, glycidyl methacrylate, bisphenol A diglycidylether (and its oligomers), vinylcyclohexene oxide and phosphorus-containing compounds, for example dimethylallylphosphonate.

The organic precursor compound may contain multifunctional compounds to increase the cross-linking density and to enhance the stability of the deposited functional compounds, such as dienes, multi-functional acrylates such as 1,6-hexanediol diacrylate, pentaerythritol penta-acrylate, pentaerythritol hexa-acrylate, trimethylolpropane ethoxylate triacrylate, etc.

Other examples of the organic precursor compound of a conjugated polymer are advantageously intrinsically conducting polymers (ICPs), oligomeric or polymeric materials composed of phenylene rings and related units. Examples of intrinsically conducting polymers (ICPs) are polyphenylene, polyphenylene vinylenes, poly(para-phenylene vinylene), polyaniline, polypyrole, polythiophenes, polyacetylene and their co-polymers. A preferred organic precursor compound is 3,4-ethylenedioxythiophene (EDOT), leading upon polymerization to a functional compound comprising the polymer poly(3,4-ethylenedioxythiophene) (PEDOT). Particularly preferred organic precursor compounds are naphthalene, anthracene or heteroaromatic rings such as pyrrole and thiophene, which are connected to one another through carbon-carbon single bonds or vinylene groups (—C=C—). The advantage of using an ICP as organic precursor compound is that the polymer obtained—the functional compound—has a low hydrogen content and an aromatic structure, which provides excellent chemical, thermal and oxidative stability. Further, functional compounds from ICP precursor compounds are insoluble in all common solvents. Advantageously the intrinsically conducting polymer is doped, such as a poly-(3-alkylthiophene).

Preferably, the coating composition comprises or consists substantially of an inorganic electrically conductive compound. The inorganic electrically conductive compound is preferably selected from colloidal silica, amorphous silica, a surface-treated silica, colloidal alumina, amorphous alumina, conductive carbon, tin oxide, vanadium oxide, titanium sulfide ($TiS_2$), zirconium oxide ($ZrO_2$), TiN, Ru, AlN, TaN, iron oxide, iron sulfide (FeS), iron titanate ($FeTiO_3$), barium titanate ($BaTiO_3$), $SnO_2$, and a mixture of two or more thereof. Vanadium oxide can refer to $VO_2$, $V_2O_3$, $V_2O_5$, or any other suitable vanadium oxide compound. The coating composition can comprise titanium oxide.

The coating composition can comprise a metal(loid) oxide or a precursor for a metal(loid) oxide. The metal(loid) oxide can be an aluminum oxide, an antimony oxide, a calcium oxide, a magnesium oxide, a tin oxide, a silicon oxide, a tungsten oxide (e.g., $WO_3$), a vanadium oxide (e.g., $VO_2$, $V_2O_3$ or $V_2O_5$), a zirconium oxide, an iron oxide and mixtures thereof. Of these, aluminum oxide, magnesium oxide, vanadium oxide, silicon oxide, tin oxide, iron oxide and mixtures thereof are preferred, and aluminum oxide, magnesium oxide, silicon oxide, vanadium oxide, iron oxide and mixtures thereof are particularly preferred. The metal oxide can be a titanium oxide, e.g. $TiO_2$ or $Ti_4O_7$.

According to another preferred embodiment, the coating composition comprises or consists substantially of an electrically conductive carbon compound. The electrically conductive carbon compound is preferably selected from graphene, conductive carbon fibers, carbon nanotubes, or a mixture of two or more thereof.

According to a further preferred embodiment, the coating composition comprises or consists substantially of a hybrid organic-inorganic compound or a precursor of a hybrid organic-inorganic compound. A hybrid organic-inorganic compound may be an organically functionalized inorganic compound. Suitable examples of such hybrid organic-inorganic compounds are metal(loid) alkoxides, such as alkoxides of the metals indicated above for the metal oxides, including silicon alkoxides (alkoxysilanes), such as tetraethoxysilane (tetraethyl orthosilicate, TEOS) and tetramethoxysilane (tetramethyl orthosilicate, TMOS). Specific examples of suitable metal alkoxides are aluminum sec-butoxide, vanadium oxytriethoxide and vanadium oxytriisopropoxide. Other examples are titanium isopropoxide and titanium n-propoxide. Further suitable examples of hybrid organic-inorganic compounds are organically functionalized metal(loid) alkoxides, such as organically functionalized alkoxysilanes (e.g. functionalized with acrylic or epoxy groups) disclosed, for instance, in WO 2005/095007, 13 Oct. 2005, the contents of which are incorporated herein by reference. Possible examples of organically functionalized alkoxysilanes are: propyltrimethoxysilane, phenyltrimethoxysilane, diphenyldimethoxysilane, mercaptopropyltrimethoxy-silane, tridecafluoro-triethoxysilane, aminopropyltriethoxy-silane, trimethylammonium-propyltrimethoxysilane, octadecyldimethylammonium-propyltrimethoxysilane, vinylbenzyl ammoniumethyl aminopropyltrimethoxysilane, succinic acid anhydride propyl triethoxysilane. Examples of monomer silanes with reactive groups are as follows: glycidoxypropyl-trimethoxysilane, vinyltrimethoxy-silane, methacryloxypropyl-trimethoxysilane, TPGDA-silane, TEGDA-silane, BPADA-silane, LR 8765 silane, GDMA-silane, PETA-silane, the chemical formulas of which are described in WO 2005/095007, 13 Oct. 2005, pages 19 and 20. Precursors of organically functionalized inorganic compounds can be synthesized via sol-gel processing, in particular through hydrolysis and condensation. Alternatively, a hybrid organic-inorganic compound may be an inorganically functionalized organic compound. Suitable examples of such hybrid organic-inorganic compounds are organic compounds as mentioned above comprising colloidal metals, metal oxides and/or organometallic compounds.

Preferably, the coating composition may comprise two or more of the afore-mentioned compounds. By using a coating composition comprising two or more of such compounds, the characteristics of the functional compound applied to the sulfur particles may be optimized. For example, when using the sulfur particles as cathode material in a Li—S battery, the compatibility or affinity of the sulfur particles comprising the functional compound to the electrolyte used in the battery may be enhanced. Other characteristics that may be optimized, without being limited thereto, are the miscibility, the flowability, the dispersibility, and/or the barrier properties of the sulfur particles comprising the functional compound.

Referring to FIG. 2, the coating composition 2 may be supplied to the atmospheric pressure plasma discharge 4 comprising a gas 5 and/or to the activated gas flow 6 resulting from the atmospheric pressure plasma discharge in the form of a liquid, an aerosol, a dispersion, an emulsion, a liquid solution, or a combination of two or more thereof.

Preferably, the coating composition is supplied in the form of an aerosol. The aerosol may be an aerosol generating droplets having a droplet size equal to or lower than 5 μm, such as 4 μm, 3 μm, 2.5 μm, 2 μm, 1.5 μm, 1 μm, or lower. Preferably, the droplet size is equal to or lower than 2 μm. The applicants have found that by using droplets having a size of 2 μm or lower, an optimal distribution in the atmospheric pressure plasma discharge comprising a gas, or in the activated gas resulting therefrom, may be obtained. An optimal distribution allows to apply the functional compound in an uniform and homogeneous, and repeatable way to the sulfur particles.

The coating composition may optionally comprise a photo-initiator. A photo-initiator may be provided to enhance the reactivity of the coating composition and the deposition of the functional compound on the sulfur particles during the step of contacting the sulfur particles and the coating composition. A photo-initiator for enhancing the deposition of the functional compound is advantageously a photo-initiator which is activated by the atmospheric pressure plasma discharge comprising a gas or by the activated gas flow resulting from the atmospheric pressure plasma discharge. Examples are a free-radical photo-initiator, a photo-latent acid and a photo-latent base. Additionally or alternatively, a photo-initiator may be provided to enhance the curing rate of the functional coating during the (optional) curing step, in particular a curing step by irradiation.

Examples of free-radical photo-initiators are camphorquinone, benzophenone and derivatives thereof, acetophenone and derivates thereof, for example a-hydroxyacetophenone, e.g. a-hydroxycycloalkylphenyl ketone, in particular (1-hydroxycyclohexyl)-phenyl ketone, or 2-hydroxy-2-methyl-1-phenyl-propanone, dialkoxyacetophenone, e.g. 2,2-dimethoxy-1,2-diphenylethan-1-one. Other examples are a-aminoacetophenone, e.g. (4-methylthiobenzoyl)-1-methyl-1-morpholino-ethane, (4-morpholino-benzoyl)-1-benzyl-1-dimethylamino-propane, 4-aroyl-1,3-dioxolanes, benzoin alkyl ether and benzil ketal, e.g. benzil dimethyl ketal, phenylglyoxalate, and derivatives thereof, e.g. dimeric phenyl-glyoxalate, siloxane-modified phenyl glyoxalate; perester, e.g. benzophenonetetra-carboxylic acid perester, monoacylphosphine oxide, e.g. (2,4,6-trimethylbenzoyl)-phenyl-phosphine oxide; bisacylphosphine oxide, e.g. bis(2,6-dimethoxybenzoyl)-(2,4,4-trimethyl-pent-1-yl) phosphine oxide, bis(2,4,6-trimethyl-benzoyl)-phenyl-phosphine oxide or bis(2,4,6-trimethylbenzoyl)-(2,4-dipentyloxyphenyl)-phosphine oxide; trisacylphosphine oxide, halomethyltriazine, e.g. 2-[2-(4-methoxy-phenyl)-vinyl]-4,6-bis-trichloromethyl-[1,3,5] triazine, 2-(4-methoxy-phenyl)-4,6-bis-trichloro-methyl-[1,3,5] triazine, 2-(3,4-dimethoxy-phenyl)-4,6-bis-trichloromethyl-[1,3,5] triazine, or 2-methyl-4,6-bis-trichloromethyl-[1,3,5] triazine.

Referring to FIG. 1, the method of the disclosure may comprise subjecting the sulfur particles 1 to a curing step 61 after the step of contacting 32 the sulfur particles 1 and the coating composition 2. A curing step is advantageously performed when the coating composition comprises an organic precursor compound of a conjugated polymer, but may be performed for the other coating compositions as well. Whether or not a curing step is performed, depends on the coating composition itself, on the process parameters applied in the steps of supplying and contacting, and on the required properties of the functional compound.

The curing step may allow for changes in the structure of the functional compound, for example polymerization of any unreacted precursor compound remaining in the functional compound after the contacting step, or crosslinking of the functional compound. For example, when the coating compound comprises an organic precursor compound of a conjugated polymer, the curing may allow for polymerization of any unreacted precursor compound into the conjugated polymer.

Preferably, the curing step comprises subjecting the sulfur particles comprising the functional compound to irradiation. The irradiation may be UV irradiation, IR irradiation or electron beam radiation. Preferably, the irradiation is UV irradiation or electron beam irradiation. UV curing may be performed by means of a UV source having a wavelength comprised between 200 nm and 600 nm, for example between 250 nm and 500 nm, such as between 290 nm and 400 nm. The radiation dose used in UV curing may be between 2 mJ/cm$^2$ and 750 mJ/cm$^2$, such as between 5 mJ/cm$^2$ and 500 mJ/cm$^2$, for example between 10 mJ/cm$^2$ and 250 mJ/cm$^2$.

Alternatively, the curing step may comprise subjecting the sulfur particles comprising the functional compound to a thermal treatment. A thermal curing step may be performed at a temperature between 30° C. and 300° C., for example between 40° C. and 250° C., between 50° C. and 200° C., such as between 75° C. and 150° C. The thermal curing step may be performed at atmospheric pressure or at a pressure lower than atmospheric pressure. Preferably, the thermal curing step is performed at atmospheric pressure.

The curing time is the time that the sulfur particles comprising the functional compound are exposed to the radiation source or the elevated temperature. The curing time may be between 1 second and 10 minutes, for example between 2 seconds and 7 minutes, or between 5 seconds and 5 minutes, for example at least 5, 10, 15, 20, 25 or 30 seconds and less than 5, 4, 3 or 2 minutes. The optimal curing time is dependent on the parameters of the curing step, such as the type of irradiation source, the wavelength and the radiation dose, or the temperature.

Referring again to FIG. 1, the method of the disclosure may comprise a doping step 33 of the feed of sulfur particles 1 and/or the coating composition 2. A doping step is particularly advantageous for a coating composition and/or a feed of sulfur particles to be contacted with a coating composition, comprising at least one organic precursor compound of a conjugated polymer. Upon doping, some of the delocalized electrons present in the conjugated p-orbitals of the organic precursor compound of a conjugated polymer, which form a one-dimensional electronic band, are removed to obtain electrical conductivity because of the increased mobility of the remaining electrons in the conjugated p-orbitals of the precursor compound. Hence, the doping allows for the formation obtaining an electrically conductive functional compound from the organic precursor compound of a conjugated polymer.

Suitable doping compositions advantageously include conductive polymers, an oxidizing agent or a reducing agent which may serve the purpose of amending the oxidation state of the functional compound. Preferably, the doping is performed with an electrically conductive material, selected from the group of $I_2$, $NOBF_4$, $O_2$, $O_3$, ITO, or a mixture of two or more hereof. Such doping compositions are capable of creating charge defects (polaron, bipolaron and soliton) that can travel through the conduction band. Preferably, the doping step is an oxidative doping step. An oxidative doping step is a doping step wherein the sulfur particles and/or the coating composition are oxidized.

The doping step may be performed advantageously in the atmospheric pressure plasma discharge comprising a gas or the activated gas flow resulting from the atmospheric pressure plasma discharge. According to a preferred embodiment, the doping step is an oxidative doping step performed in the atmospheric pressure plasma discharge comprising a gas or the activated gas flow resulting therefrom. According to an even more preferred embodiment, the doping is performed with the gas in the atmospheric pressure plasma discharge or the activated gas flow resulting therefrom, wherein the gas is an electrically conductive material that allows for oxidation of the coating compound and/or the sulfur particles.

The doping composition comprises advantageously oxygen, for example a mixture of argon and oxygen. Preferably, for an argon/oxygen mixture the percentage of argon is between 25% and 99% of the total gas flow, such as between 50% and 98%, such as at least 60%, 75%, 80% or 90%. The percentage of oxygen is between 1% and 75% of the total gas flow, such as between 2% and 50%, such as at most 40%, 25%, 20% or 10%. For example, the mixture may comprise 95% argon and 5% oxygen.

Referring again to FIG. 1, the method of the present disclosure may further comprise a deposition step, the deposition step comprising the deposition of a first coating 21 on the sulfur particles 1 prior to the step of supplying 31 to one or more of an atmospheric pressure plasma discharge comprising a gas, or an activated gas flow resulting from the atmospheric pressure plasma discharge, one or more of a feed of sulfur particles 1, and a coating composition 2.

The first coating can comprise silica, a surface-treated silica, alumina, conductive carbon, a tin oxide, a titanium oxide, a vanadium oxide, titanium sulfide ($TiS_2$), zirconium oxide ($ZrO_2$), TiN, Ru, AlN, TaN, iron oxide, iron sulfide (FeS), iron titanate ($FeTiO_3$), barium titanate ($BaTiO_3$), $SnO_2$, or a mixture of two or more thereof. The first coating advantageously comprises $TiO_2$, $ZrO_2$, $SiO_2$, $Al_2O_3$ TiN, Ru, AlN, TaN, vanadium oxide (e.g., $V_2O_5$), or a mixture of two or more thereof. The first coating may be a barrier coating. The first coating may be an electrically conductive coating. Alternatively and preferably, the first coating may be an electrically non-conductive coating. When the sulfur particles are used to form a cathode for use in a lithium-sulfur battery, the coating may limit the mobility of the sulfur particles in the cathode, and consequently may reduce irreversible loss of cathode material to the electrolyte by the so-called sulfur shuttling issue, thereby increasing the lifespan of the battery.

Preferably, the first coating is deposited by supplying a precursor of the first coating to the atmospheric pressure plasma discharge comprising a gas or to the activated gas flow resulting therefrom, thereby forming an excited precursor of the first coating, simultaneously with or followed by depositing the excited precursor compound on the sulfur particles to form the first coating. Optionally, the sulfur particles comprising the first coating may be cured 22 prior to performing the step of supplying 31 to one or more of an atmospheric pressure plasma discharge comprising a gas, and an activated gas flow resulting therefrom, one or more of the feed of sulfur particles comprising the first coating, and a coating composition 2.

The precursor of the first coating may be supplied to the atmospheric pressure plasma discharge comprising a gas and/or to the activated gas flow resulting therefrom in the form of a liquid, an aerosol, a dispersion, an emulsion, a liquid solution, or a combination of two or more thereof. Preferably, the precursor of the first coating is supplied in the form of a liquid.

Alternatively, the first coating may be deposited by means of any other suitable coating technique, such as a wet chemical coating process using an emulsion or dispersion based on water and/or a solvent, a dip coating process, or a spray coating process.

Referring again to FIG. 1, the method of the present disclosure may further comprise a second deposition step 41, the deposition step 41 comprising the deposition of a second coating on the sulfur particles after the step of contacting 32 the sulfur particles 1 and the coating composition 2 to apply a functional compound to the sulfur particles. If a curing step 61 is performed on the sulfur particles after the step of contacting 32 the sulfur particles 1 and the coating composition 2, the second deposition step 41 may be performed prior to this curing step 61.

Preferably, the second coating is deposited by supplying a precursor of the second coating to the atmospheric pressure plasma discharge comprising a gas or to the activated gas flow resulting therefrom, thereby forming an excited precursor of the second coating, followed by depositing the excited precursor compound on the sulfur particles comprising a functional compound to form the second coating.

The second coating advantageously is a conductive coating. The second coating may comprise graphene, conductive carbon fibers, or a combination thereof.

The precursor of the second coating may be supplied to the atmospheric pressure plasma discharge comprising a gas and/or to the activated gas flow resulting therefrom in the form of a liquid, an aerosol, a dispersion, an emulsion, a liquid solution, or a combination of two or more thereof. Preferably, the precursor of the second coating is supplied in the form of a liquid.

Alternatively, the second coating may be deposited by means of any other suitable coating technique, such as a wet chemical coating process using an emulsion or dispersion based on water and/or a solvent, a dip coating process, or a spray coating process.

According to the present disclosure, treated sulfur particles comprising a functional compound arranged on a surface of the sulfur particles are provided. The treated sulfur particles can be obtained by the methods as described herein. The functional compound provides the treated sulfur particles with an electrically conductive surface. The functional compound comprises a conjugated polymer of at least one organic precursor, or results from converting at least one electrically conductive carbon coating, at least one inorganic electrically conductive compound, at least one hybrid organic-inorganic compound, or a mixture thereof.

Preferably, the treated sulfur particles have an electrical conductivity equal to or higher than $10^{-8}$ S/cm. Compared to untreated sulfur particles, the treated sulfur particles advantageously have an electrical conductivity that is increased by a factor of at least $10^3$, for example at least $10^4$, $10^5$, $10^6$, or preferably at least $10^7$.

The electrical conductivity of the sulfur particles can be measured by a device comprising a pneumatical metal piston and a pressure regulator. Upon performing the measurement, the pressure regulator presses the powder to a metal surface plate. The piston and the plate are connected to an electrical resistance meter. When a measurement is to be performed, the material to be tested (e.g. the sulfur particles) is placed in a small cavity between the piston and the metal surface. Next, the material is compressed by the piston at a pressure range between 0.5 bar and 2 bar against the metal plate to form an electrical circuit. When the meter applies a low current to the system, the electrical resistance of the material to be measured (e.g. the sulfur particles) is measured and subsequently converted to a value of electrical conductivity.

The treated sulfur particles can be used in the manufacture of a cathode, such as a cathode for a battery cell, advantageously a lithium-sulfur battery cell. The cathode may comprise a mixture comprising the treated sulfur particles.

The mixture may comprise or consist substantially of the treated sulfur particles and carbon, for example a microporous carbon mixture, a mesoporous carbon mixture, a carbon mixture having a combination of micropores and mesopores, a graphite mixture, a graphene mixture, a graphene oxide (GO) mixture, a mixture comprising carbon nanotubes (CNT), or a mixture comprising carbon nanofibers. According to the IUPAC definition, micropores have an average size (diameter or equivalent diameter of a spherical pore having the same volume) of less than 2 nm, while mesopores have an average size (diameter or equivalent diameter of a spherical pore having the same volume) between 2 nm and 50 nm, and macropores have an average size (diameter or equivalent diameter of a spherical pore having the same volume) of at least 50 nm. The matrix may be doped, for example nitrogen-doped. It is known in the field that a nitrogen-doped carbon-comprising microporous or mesoporous mixture may promote the bond between the components, reducing the loss of sulfur active cathode material due to diffusion.

Providing the sulfur particles with an electrically conductive surface as described herein allows to reduce the amount of particles embedded in a certain amount of matrix material while maintaining the same electrical conductivity. This allows a faster charging of a battery cell comprising the cathode of the disclosure. In other words, for a constant quantity of particles and matrix material, the conductivity of the cathode comprising the coated particles of the disclosure is significantly higher than for the same quantity of uncoated particles.

The cathode may comprise a cathode coating. The coating may be similar to the electrically conductive functional compound applied to the Sulfur particles as described above. Preferably, the cathode coating is conductive to lithium ions ($Li^+$ ions) and/or insulating to electrons. The cathode coating may reduce the diffusion of polysulfides that are formed out of the electrode into the electrolyte, hereby reducing the so-called sulfur shuttling effect. The cathode coating optionally comprises $Al_2O_3$, polyethylene oxide or polyethylene glycol.

The cathode as described herein can be used as the cathode in a lithium-sulfur battery cell. The Li—S battery cell further comprises a lithium-based anode and an electrolyte.

The electrolyte may be a solid electrolyte. A solid electrolyte may be a solid polymer or a solid inorganic glass. For example, the solid electrolyte may be poly(ethylene oxide) (PEO) with lithium salts dispersed in the polymer matrix of the PEO.

Alternatively, the electrolyte may be a liquid electrolyte, advantageously comprising a binder. The electrolyte may be an ionic liquid, optionally comprising an organic component, a salt-solvent mixture, preferably a super-saturated salt-solvent mixture. For example, a liquid electrolyte may be an ionic liquid with lithium salt dissolved therein, or a mixture of an ionic liquid and an organic liquid with a dissolved lithium salt. Examples of liquids that may be used include polyethylene glycol dimethyl ether (PEGDME) or an organic solvent such as dioxolane mixed with dimethyl ether. The liquid electrolyte may comprise a compound of tetraethylene glycol dimethyl ether (PEGDME) and lithium bis(trifluorosulfonyl)imide (LiTFSI). A useful ionic liquid is methyl-butyl pyridinium trifluorosulfonyl imide (PYR14TFSI). The electrolyte may also include lithium bis(trifluoromethanesulfonyl)imide (LiTFSI) and/or lithium nitrate (LiNO3). In one example, the electrolyte has a 1:1 ratio by weight of PYR14TFSI and PEGDME, with 1 mol/kg LiTFSI.

Yet alternatively, the electrolyte may be a gel electrolyte. A gel electrolyte may be a polymer-gelled organic medium. For example, the gel electrolyte may be a mixture of poly(methyl methacrylate) (PMMA), a lithium salt and a small amount of liquid.

The battery cell may further comprise a battery separator membrane, in particular when the electrolyte is a liquid electrolyte. Preferably, the battery separator membrane is a porous separator membrane. Polymeric battery separator membranes known in the field may be used, such as a porous polypropylene (PP) membrane or a porous polyethylene (PE) membrane. For example, a polypropylene membrane having a thickness of 25 μm and a porosity of 50% may be used. PP and PE are preferred materials because of their chemically inert character. However they are not easily wetted, while it is preferred that the porous separator may absorb the liquid electrolyte. To this end the hydrophobic PP and PE may be treated with a surface treatment or a coating, such as a spray coating, a dip coating or a plasma coating—atmospheric pressure plasma or low pressure plasma. Alternatively, the battery separator membrane may be a ceramic material.

The presence of the functional compound on the sulfur particles of the cathode as described herein has a multiple of advantages, for example—without being limited thereto:
- reduction of the amount of conductive material or electrolyte solid interphase, for example a carbon framework, that needs to be inserted between the anode and the cathode, compared to uncoated sulfur particles as cathode material;
- reduction of the mobility of the sulfur particles, which may reduce, even suppress, the formation of polysulfides;
- reduction of the formation of lithium polysulfides, which may reduce the lithium dendrite growth;
- reduction and better accommodation of volume changes of the sulfur particles during charging and discharging of the battery (cell), i.e. crimping as well as expansion, which is obtained by the (limited) degree of elasticity of the functional compound, which may reduce mechanical stress on the cathode of the battery cell.

The method of the present disclosure is advantageously performed by means of an atmospheric pressure plasma device, such as atmospheric pressure plasma devices known in the art. Referring to FIG. 2, an apparatus 10 for performing methods according to the present disclosure advantageously comprises a central electrode 101, an outer electrode 102 surrounding the central electrode 101 and being coaxial with the central electrode 101, and an electrical insulator 103 which is coaxially disposed between the central electrode 101 and the outer electrode 102. The outer electrode 102, or the electrical insulator 103 define a discharge lumen 104 in which a plasma occurs. The central electrode 101 may be grounded and the outer electrode 102 may be the electrode to which the voltage is applied by the power source (not shown). Alternatively, the outer electrode may be grounded and the central electrode may be the electrode to which the voltage is applied by the power source.

The electrical insulator 103 may be a dielectric medium. Advantageously, the distance between an outer surface of the central electrode 101 and an inner surface of the electrical insulator 103 lies between 0.1 mm and 10 mm. The discharge lumen 104 extends between a distal end 105 and a proximal end 106. A supply opening 107 disposed at the distal end 105 of the discharge lumen 104 allows for supplying a coating composition 2 and/or a feed of sulfur particles 1 to the discharge lumen 104. Possibly, the sulfur particles 1 and the coating composition 2 are supplied simultaneously to the supply opening 107. Treated (coated) sulfur particles 3 are obtained at the proximal end 106.

The atmospheric pressure plasma coating apparatus 10 comprises a power source (not shown) to apply a voltage between the central electrode 101 and the outer electrode 102. The electrical insulator 103 extends in a radially placed ring at the proximal end 106 beyond the outer surface of the outer electrode 102, to generate the atmospheric pressure plasma discharge in an area 4 of the discharge lumen 104.

The power source is preferably arranged to provide an AC or DC voltage, between 0.5 kV and 20 kV, such as between 1 kV and 10 kV. The applied power, in absolute value, for a discharge lumen having a volume of 56.5 cm$^3$ (0.0565 liter), may be between 1 W and 5000 W, such as between 10 W and 2500 W, between 20 W and 2000 W, between 50 W and 1500 W, between 100 W and 1000 W, preferably between 200 W and 750 W. The applied power per unit of electrode surface may be between 0.25 W/cm$^2$ and 2.5 W/cm$^2$, such as between 0.3 W/cm$^2$ and 2 W/cm$^2$, preferably between 0.5 W/cm$^2$ and 1.8 W/cm$^2$ (corresponding to an absolute power value between 200 W and 750 W for a chamber with a volume of 56.5 cm$^3$).

The voltage may be applied to the electrodes by the power source as a continuous wave, i.e. the atmospheric pressure plasma discharge may be a continuous wave discharge.

Alternatively, the voltage may be applied to the electrodes by the power source as a pulsed wave, i.e. the atmospheric pressure plasma discharge may be a pulsed plasma discharge.

The frequency of the voltage applied by the power source may be between 1 kHz and 1 GHz, for example 18 kHz or 13.56 MHz.

EXAMPLES 1-5

Sulfur particles were used as the untreated reference sample, and samples 1 to 5 were prepared from this reference material by applying a functional compound by means of a method according to the present disclosure. Table 1 summarizes the process parameters of the processes used to obtain samples 1 to 5 (examples 1-5). The feed of sulfur particles and the coating compound were supplied to the atmospheric pressure plasma discharge of FIG. 2 through supply opening 107. Argon (Ar) was used as the plasma forming gas 5 in the atmospheric pressure plasma discharge.

The coating composition used for the coating of samples 1 to 5 was 3,4-Ethylenedioxythiophene (EDOT), an organic precursor compound of a conjugated polymer, in particular a precursor of an intrinsically conjugated polymer (ICP), leading to the polymer poly(3,4-ethylenedioxythiophene) (PEDOT) as the functional compound. No first and second coatings were deposited.

The untreated reference sulfur particles had an electrical conductivity of $10^{-15}$ S/cm determined through the method described hereinabove. All samples of table 1 were found to have an electrical conductivity which is at least $10^7$ S/cm better than the electrical conductivity of the reference sulfur particles.

COMPARATIVE EXAMPLE A

Figure 3:
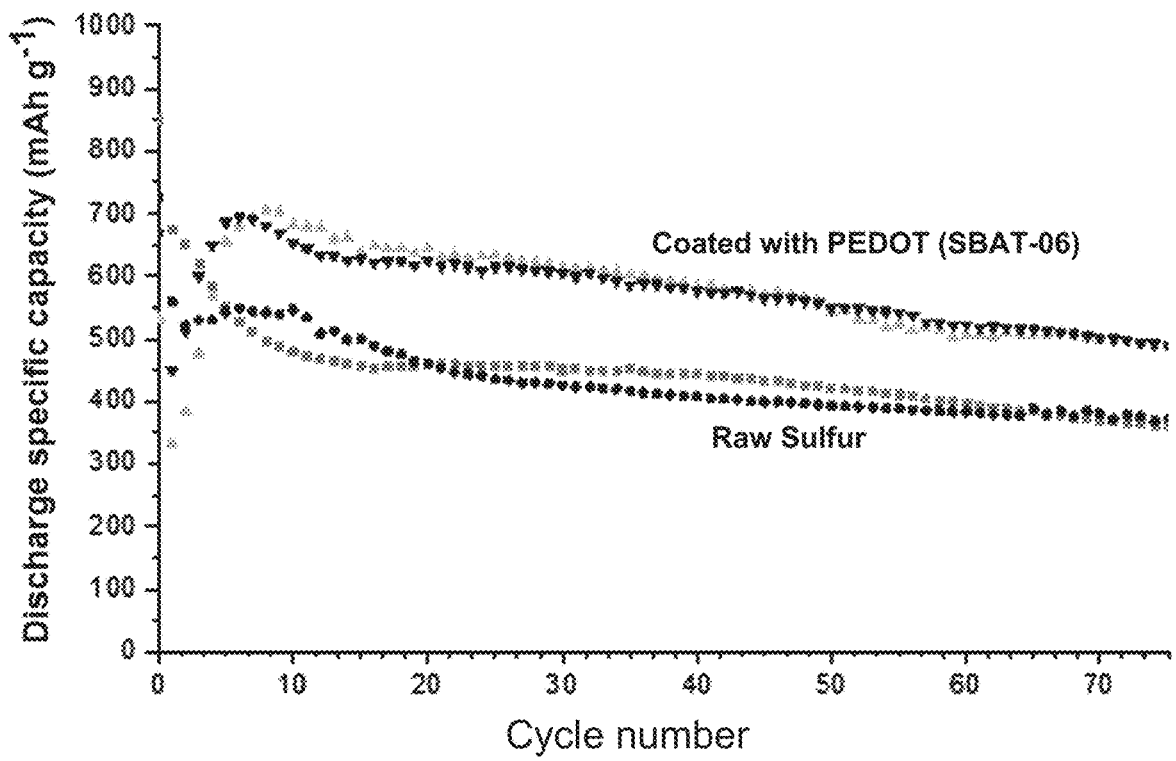
FIG. 3 represents electrochemical data for Li—S coin cells related to discharge specific capacity vs. cycle number at a cycling rate of C/10 (25° C.) for both coated (SBAT-A06) and uncoated sulfur, cycled between 1.5-3.5V vs. $Li^+/Li$.

A Li—S coin cell was produced using non-coated S particles. The cell was cycled between 1.5-3.5V vs. Li$^+$/Li. The discharge specific capacity was measured after each cycle. The results are shown in FIG. 3.

EXAMPLE 6

A Li—S coin cell was produced using the S particles of example 1. The cell was cycled between 1.5-3.5V vs. Li$^+$/Li. The discharge specific capacity was measured after each cycle. The results are shown in FIG. 3.

From the comparison with comparative example A it can be observed that the Li—S cells containing the PEDOT-coated sulfur powder (conductivity 10-5 S/cm) show improved electrochemical performances in terms of capacity and fading, when compared to cells using standard pristine sulfur.

TABLE 1

Process conditions of plasma treatment of sulfur particles

|  | Example 1 | Example 2 | Example 3 | Example 4 | Example 5 |
|---|---|---|---|---|---|
| Pre-drying of S particles (8 h desiccator + 30 min at 60° C.) | Yes | Yes | Yes | Yes | Yes |
| Plasma gas (for S particles) | Ar | Ar | Ar | Ar | Ar |
| Plasma gas flow (slm) | 30 | 30 | 30 | 30 | 60 |
| Plasma discharge power (W) | 500 | 500 | 500 | 500 | 500 |
| Additive gas flow of plasma discharge $O_2$ (slm) | 1.5 | 1.5 | 1.5 | 1.5 | 1.5 |
| Coating composition | EDOT | EDOT | EDOT | EDOT | EDOT |
| Flow of coating composition (g/min) | 30 | 30 | 75 | 75 | 75 |
| Power mode | Cw | Cw | Cw | Cw | Cw |
| Frequency kHz | 18 | 18 | 18 | 18 | 18 |
| Process time (min) | 25 | 556 | 25 | 55 | 25 |
| Electrical conductivity (S/cm) | 1.0E−08 | 3.3E−07 | 1.2E−05 | 7.5E−06 | 5.5E−07 |
| Doping | In the atm. pressure plasma discharge comprising $O_2$ | | | | |

EXAMPLE 7

The experiments of examples 1-5 were repeated using different coating compositions: thiophene; aniline and pyrrole to obtain sulfur particles coated/functionalized with polythiophene (PT), polyaniline (PANI) and polypyrrole (PPy) respectively. The electrical conductivity of the coated sulfur particles was measured and was found to be on the order of $10^{-6}$ S/cm for PT coated sulfur particles, on the order of $10^{-7}$ S/cm for PANI coated sulfur particles and on the order of $10^{-8}$ S/cm for PPy coated sulfur particles.

Figure 4:
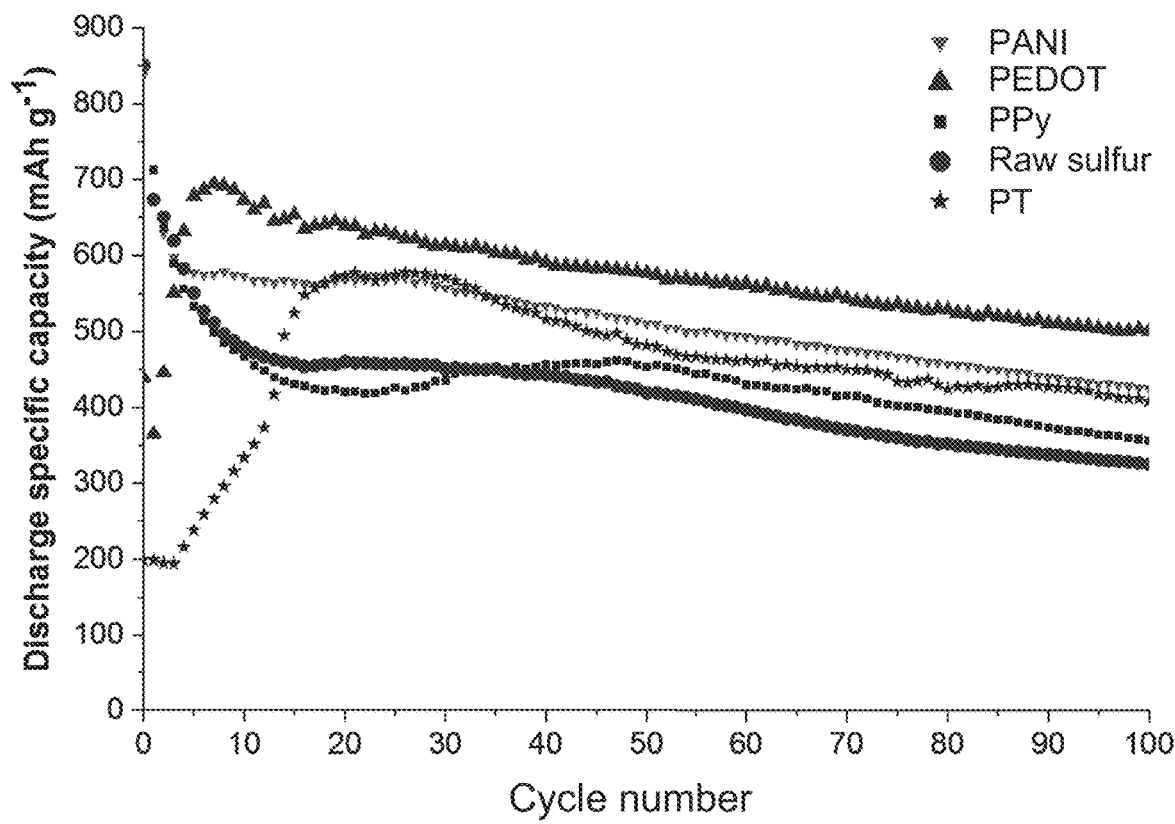
FIG. 4 represents additional electrochemical data for Li—S coin cells related to discharge specific capacity vs. cycle number at a cycling rate of C/10 (25° C.) for single coated sulfur particles for various organic coating compositions, cycled between 1.5-3.5V vs. $Li^+/Li$.

For each coating composition of example 7, a Li—S coin cell was produced utilizing the corresponding coated sulfur particles for the cathode. The sulfur loading was about 4.5 mg/cm². The cell was cycled between 1.5-3.5V vs. Li⁺/Li at C/10 (25° C.). The discharge specific capacity was measured after each cycle. The results are shown in FIG. 4 and compared to the performance of batteries with raw sulfur (comparative example A) and PEDOT coated sulfur particles (examples 1-5). From FIG. 4 it can be seen that batteries having cathodes made with PT and PANI coated sulfur particles show an increased specific capacity. The PT coated sulfur particles show a reduced discharge specific capacity during the initial cycles, possibly due to activation of the coating. The PANI coated sulfur particles show an enhanced cyclic stability of the discharge specific capacity. The PPy coated sulfur particles show a low discharge specific capacity in the starting cycles, but a decreased capacity fading, in particular after 30 cycles.

EXAMPLE 8

Figure 5:
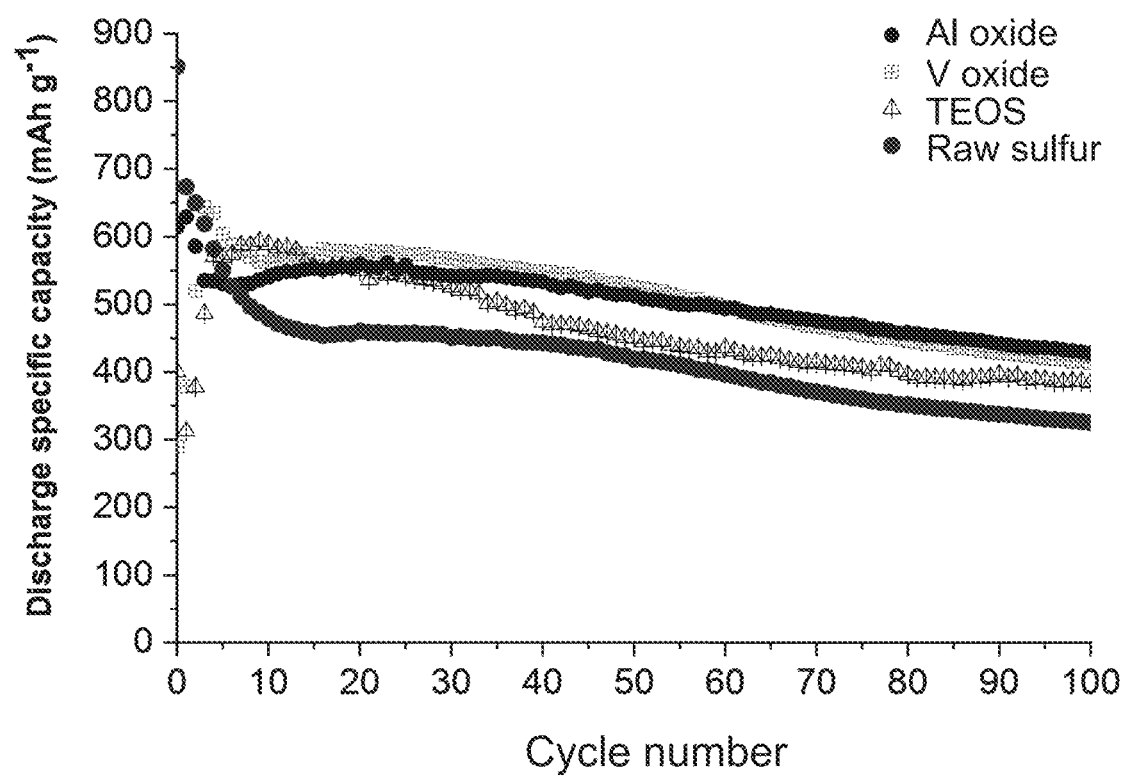
FIG. 5 represents additional electrochemical data for Li—S coin cells related to discharge specific capacity vs. cycle number at a cycling rate of C/10 (25° C.) for single coated sulfur particles for various inorganic and hybrid coating compositions, cycled between 1.5-3.5V vs. $Li^+/Li$.

The experiments of examples 1-5 were repeated using the coating compositions (precursors) indicated in Table 2 under same plasma and gas flow conditions as for examples 1-5. With each of the obtained coated/functionalized sulfur particles, a Li—S coin cell was produced, utilizing the corresponding coated sulfur particles for the cathode. The sulfur loading was about 4.5 mg/cm². The cell was cycled between 1.5-3.5V vs. Li⁺/Li at C/10 (25° C.). The discharge specific capacity was measured after each cycle. The results are shown in FIG. 5 and compared to the performance of batteries with raw sulfur (comparative example A). It can be seen from FIG. 5 that aluminum oxide and vanadium oxide coated sulfur particles (Al oxide and V oxide respectively in FIG. 5) show high specific capacity with reduced fading and high cyclic stability. The performance of TEOS coated sulfur particles is somewhat lower than for Al oxide and V oxide, but still improved over the raw sulfur.

TABLE 2

Hybrid organic-inorganic coatings of example 8 and corresponding precursors used in the atmospheric pressure plasma apparatus

| Functional compound | Precursor |
|---|---|
| Aluminum oxide | Aluminum Sec butoxide (97%) |
| Vanadium oxide | Vanadium (V) oxytriethoxide (95%) |
| TEOS | Tetraethyl orthosilicate (98%) |

The invention claimed is:

1. A method for applying a functional compound on sulfur particles, the method comprising:
   (i) supplying to one or more of:
      an atmospheric pressure plasma discharge comprising a gas, and
      an activated gas flow resulting from the atmospheric pressure plasma discharge,
   one or more of:
      a feed comprising sulfur particles, and
      a coating composition,
   (ii) contacting the sulfur particles and the coating composition, wherein the coating composition, which is converted into the functional compound, is applied to the sulfur particles, to form coated sulfur particles;
   wherein the coating composition comprises at least one compound selected from the group consisting of: an inorganic electrically conductive compound, an electrically conductive carbon compound, an organic precursor compound of a conjugated polymer, and a hybrid organic-inorganic compound; and wherein the functional compound provides the sulfur particles with an electrically conductive surface.

2. The method of claim 1, comprising exposing the sulfur particles to one or more of the atmospheric pressure plasma discharge and the activated gas flow resulting from the discharge, prior to contacting the sulfur particles and the coating composition.

3. The method according to claim 2, comprising exposing the coating composition to one or more of the atmospheric pressure plasma discharge and the activated gas flow resulting from the discharge, prior to contacting the coating composition with the sulfur particles.

4. The method of claim 1, comprising exposing the coating composition to one or more of the atmospheric pressure plasma discharge and the activated gas flow resulting from the discharge, prior to contacting the coating composition and the sulfur particles.

5. The method according to claim 1, comprising repeating supplying one or more of the feed and the coating composition and contacting the coated sulfur particles and the coating composition multiple times.

6. The method according to claim 1, further comprising drying the sulfur particles prior to contacting the sulfur particles and the coating composition.

7. The method according to claim 6, wherein the sulfur particles are dried at a temperature between 50° C. and 200° C.

8. The method according to claim 1, wherein the coating composition comprises a curable precursor compound being one of the at least one inorganic electrically conductive compound, the at least one electrically conductive carbon compound, the at least one organic precursor compound of a conjugated polymer, and the at least one hybrid organic-inorganic compound, wherein the method further comprises curing the sulfur particles after contacting the sulfur particles and the coating composition.

9. The method according to claim 8, wherein curing the sulfur particles comprises subjecting the sulfur particles comprising the functional compound to irradiation.

10. The method according to claim 1, wherein the one or more of the feed of sulfur particles and the coating composition are doped with an electrically conductive material comprising one or more of $I_2$, $NOBF_4$, $O_2$, $O_3$, and ITO.

11. The method according to claim 1, wherein the coating composition comprises the inorganic electrically conductive compound, and the inorganic electrically conductive compound is selected from the group consisting of colloidal silica, amorphous silica, a surface-treated silica, colloidal alumina, amorphous alumina, conductive carbon, tin oxide, titanium oxide, vanadium oxide, titanium sulfide, zirconium oxide, titanium nitride, ruthenium, aluminum nitride, tantalum nitride, iron oxide, iron sulfide, iron titanate, barium titanate, and stannic oxide.

12. The method according to claim 1, wherein the coating composition comprises the electrically conductive carbon compound, and the electrically conductive carbon compound is selected from the group consisting of graphene, conductive carbon fibers, carbon nanotubes, and a mixture of two or more of graphene, conductive carbon fibers, and carbon nanotubes.

13. The method according to claim 1, wherein the coating composition comprises the hybrid organic-inorganic compound and the hybrid organic-inorganic compound is selected from the group consisting of: a metal alkoxide, a metalloid alkoxide, an organically functionalized metal alkoxide, an organically functionalized metalloid alkoxide.

14. The method according to claim 13, wherein the metal is selected from the group consisting of aluminum, antimony, calcium, magnesium, tin, titanium, tungsten, vanadium, zirconium, and iron, and wherein the metalloid is silicon.

15. The method according to claim 1, wherein the coating composition is supplied to the one or more of the atmospheric pressure plasma discharge and the activated gas flow resulting from the atmospheric pressure plasma discharge in the form of a liquid, an aerosol, a dispersion, an emulsion, and/or a liquid solution.

16. The method according to claim 1, wherein the method comprises depositing a first coating on the sulfur particles prior to one or more of: the supplying of one or more of the feed and the coating composition and the contacting the sulfur particles and the coating composition.

17. The method according to claim 16, wherein the first coating comprises silica, a surface-treated silica, alumina, conductive carbon, a tin oxide, a titanium oxide, a vanadium oxide, titanium sulfide, zirconium oxide, titanium nitride, ruthenium, aluminum nitride, tantalum nitride, iron oxide, iron sulfide, iron titanate, barium titanate, and/or stannic oxide.

18. The method according to claim 1, wherein the coating composition comprises a mixture of two or more inorganic electrically conductive compounds selected from the group consisting of colloidal silica, amorphous silica, a surface-treated silica, colloidal alumina, amorphous alumina, conductive carbon, tin oxide, titanium oxide, vanadium oxide, titanium sulfide, zirconium oxide, titanium nitride, ruthenium, aluminum nitride, tantalum nitride, iron oxide, iron sulfide, iron titanate, barium titanate, and stannic oxide.

19. The method according to claim 1, wherein the coating composition comprises a mixture of two or more of a metal alkoxide, a metalloid alkoxide, an organically functionalized metal alkoxide, and an organically functionalized metalloid alkoxide.

20. A method for applying a functional compound on sulfur particles, the method comprising:
(i) supplying to one or more of:
an atmospheric pressure plasma discharge comprising a gas, and
an activated gas flow resulting from the atmospheric pressure plasma discharge,
one or more of:
a feed comprising sulfur particles, and
a coating composition,
(ii) contacting the sulfur particles and the coating composition, wherein the coating composition is converted into the functional compound, wherein the coating composition and/or the functional compound is applied to the sulfur particles;
wherein the coating composition comprises at least one compound selected from the group consisting of: an inorganic electrically conductive compound, an electrically conductive carbon compound, an organic precursor compound of a conjugated polymer, and a hybrid organic-inorganic compound; and
wherein the functional compound provides the sulfur particles with an electrically conductive surface.

* * * * *